United States Patent [19]

Pfeifer

[11] Patent Number: 4,657,832
[45] Date of Patent: Apr. 14, 1987

[54] PHOTOSENSITIVE POLYMERS AS COATING MATERIALS

[75] Inventor: Josef Pfeifer, Therwil, Switzerland

[73] Assignee: Ciba-Geigy Corporation, Ardsley, N.Y.

[21] Appl. No.: 608,754

[22] Filed: May 10, 1984

[30] Foreign Application Priority Data

May 18, 1983 [CH] Switzerland .......................... 2690/83
Oct. 12, 1983 [CH] Switzerland .......................... 5569/83

[51] Int. Cl.$^4$ .......................... G03C 5/16; G03C 1/71
[52] U.S. Cl. .......................... 430/18; 430/270; 430/280; 430/325; 522/904; 522/905; 522/35; 522/164
[58] Field of Search ............... 430/270, 280, 283, 325, 430/18; 528/229; 204/159.19; 522/904, 905, 35, 64

[56] References Cited

U.S. PATENT DOCUMENTS

| | | | |
|---|---|---|---|
| 3,325,450 | 6/1967 | Holub | 260/46.5 |
| 3,634,304 | 1/1972 | Suzuki et al. | 528/229 X |
| 3,666,709 | 5/1972 | Suzuki et al. | 528/229 X |
| 3,759,913 | 9/1973 | Blackley | 528/229 X |
| 3,926,638 | 12/1975 | Rosen et al. | 430/280 X |
| 4,331,705 | 5/1982 | Samudrala | 427/54.1 |
| 4,451,551 | 5/1984 | Kataoka et al. | 430/270 |
| 4,578,166 | 3/1986 | Uno et al. | 522/164 X |

FOREIGN PATENT DOCUMENTS

| | | |
|---|---|---|
| 3007445 | 9/1981 | Fed. Rep. of Germany . |
| 91714 | 5/1981 | Japan .......................... 204/159.19 |
| 121203 | 9/1981 | Japan .......................... 204/159.19 |

Primary Examiner—Roland E. Martin
Assistant Examiner—Cynthia Hamilton
Attorney, Agent, or Firm—Luther A. R. Hall

[57] ABSTRACT

Coated material of a support, onto which is applied a radiation-sensitive coating of a homopolymer or copolymer with at least 5 mol %, based on the polymer, of structural units of the formula I

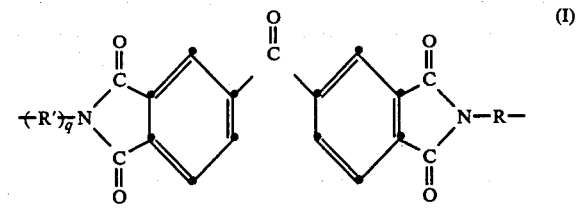

in which R is a divalent aliphatic radical which can be interrupted by hetero-atoms or aromatic, heterocyclic or cycloaliphatic groups, a cycloaliphatic, heterocyclic or araliphatic radical, an aromatic radical in which two aryl nuclei are linked via an aliphatic group, or an aromatic radical which is substituted by at least one alkyl, cycloalkyl, alkoxy, alkoxyalkyl, alkylthio, alkylthioalkyl, hydroxyalkyl, hydroxyalkoxy, hydroxyalkylthio or aralkyl group or in which two adjacent C atoms of the aromatic radical are substituted by an alkylene group, R' independently has the same meaning as R and q is 0 or 1, and in which an aromatic radical R is not substituted by alkylene or by the abovementioned radicals if q is 0. The coating can be crosslinked directly by the effect of radiation. The material is suitable, for example, for the production of protective films and relief images.

17 Claims, No Drawings

PHOTOSENSITIVE POLYMERS AS COATING MATERIALS

The present invention relates to a carrier coated with a radiation-sensitive polymer, the polymer containing benzophenonetetracarboxylic acid imide units, and to the use of this material for photographic production of relief structures and of protective films.

Photographic imaging processes with radiation-sensitive polymers for the production of relief images have achieved great importance in the production of components in electronics and semiconductor technology. Such photopolymers are required to have certain properties, depending on the intended use, and various polymers have been disclosed for this purpose. The photosensitivity of such polymers is relatively low, which necessitates the addition of photoinitiators or sensitisers in order to achieve economical exposure times. The disadvantage of such additives is that they can impair the mechanical and physical properties.

High heat stabilities of the structures produced or of photochemically produced protective coatings are furthermore desired for certain applications. Polyimides are particularly suitable for this. Because of their insolubility, soluble intermediates must be used as starting materials, and these are converted into polyimides by after-treatment with heat only after the photopolymerisation has been carried out. Direct photocrosslinking of polyimides has not yet been disclosed.

German Offenlegungsschrift No. 3,007,445 discloses polyamides and polyesters with benzophenonetetracarboxylic acid imide units. The physico-mechanical properties of fibres or films of this material can be improved by exposure. The production of protective coatings or photographic imaging processes are not mentioned at all.

The present invention relates to a coated material of a carrier, onto which is applied a coating of a radiation-sensitive polymer, wherein the polymer is a homopolymer or copolymer with at least 5 mol %, based on the polymer, of structural units of the formula I

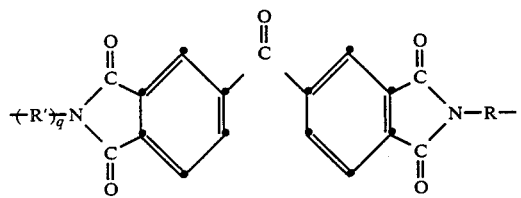

in which R is a divalent unsubstituted or substituted aliphatic radical which can be interrupted by heteroatoms or aromatic, heterocyclic or cycloaliphatic groups, an unsubstituted or substituted heterocyclic, cycloaliphaic or araliphatic radical, an aromatic radical in which two aryl nuclei are linked via an aliphatic group, or an aromatic radical which is substituted by at least one alkyl, cycloalkyl, alkoxyalkyl, alkoxy, alkylthio, alkylthioalkyl, hydroxyalkyl, hydroxyalkoxy, hydroxyalkylthio or aralkyl group or in which two adjacent C atoms of the aromatic radical are substituted by an alkylene group, R' independently has the same meaning as R and q is 0 or 1, an aromatic radical R not being substituted by alkylene or not being substituted by the abovementioned radicals in both ortho-positions relative to the N atom if q is 0.

The amount of structural elements of the formula I essentially depends on the desired photosensitivity of the homopolymers or copolymers and their build-up. The amount can be 5 to 100 mol %, preferably 20 to 100 mol %, in particular 40 to 100 mol % and especially 50 to 100 mol %, based on the polymer. Homopolymers and copolymers with 80–100 mol % of structural elements of the formula I very particularly preferred.

In homopolymers or copolymers with structural elements of the formula I in which R and R' are aliphatic or cycloaliphatic radicals, the amount of these structural elements is preferably at least 50 mol %, especially when the homopolymers and copolymers are polyamides and polyesters.

A divalent aliphatic radical R or R' in formula I preferably contains 2 to 30, in particular 6 to 30 and especially 6 to 20, C atoms. In a preferred sub-group, R and/or R' are linear or branched alkylene which can be interrupted by oxygen atoms, S, SO, SO$_2$, NH, NR$_2{}^a$, $\oplus$NR @ G$\ominus$, cyclohexylene, naphthylene, phenylene or hydantoin radicals. R$^a$ can be, for example, alkyl with 1 to 12 C atoms, cycloalkyl with 5 or 6 ring C atoms, phenyl or benzyl. G$\ominus$ is an anion of a protic acid, for example halide, sulfate or phosphate. In a preferred embodiment, R and/or R' are linear or branched alkylene with 6 to 30 C atoms, —(CH$_2$)$_m$—R$^1$—(CH$_2$)$_n$—, in which R$^1$ is phenylene, naphthylene, cyclopentylene or cyclohexylene and m and n independently of one another are the number 1, 2 or 3, —R$^2$—(OR$^3$)p$^0$—R$^2$—, in which R$^2$ is ethylene, 1,2-propylene, 1,3-propylene or 2-methyl-1,3-propylene, R$^3$ is ethylene, 1,2-propylene, 1,2-butylene, 1,3-propylene or 1,4-butylene and p is a number from 1 to 100, or

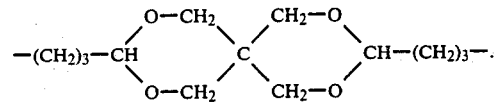

Examples of aliphatic radicals are: methylene, ethylene, 1,2- or 1,3-propylene, 2,2-dimethyl-1,3-propylene, 1,2-, 1,3- or 1,4-butylene, 1,3- or 1,5-pentylene, the hexylenes, heptylenes, octylenes, decylenes, dodecylenes, tetradecylenes, hexadecylenes, octadecylenes, eicosylenes, 2,4,4-trimethylhexylene, 1,10-dialkyldecylene, in which the alkyl preferably contains 1 to 6 C atoms, substituted 1,11-undecylenes, for example those described in European Patent B-0,011,559, Jeffamines, for example

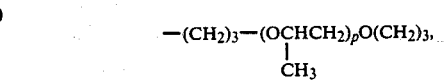

in which p is 1 to 100, or —(CH$\overline{2}$)$\overline{3}$(O(CH$\overline{2}$)$\overline{4}$)$\overline{p}$O—(CH$\overline{2}$)$\overline{3}$ in which p is 1–100, dimethylenecyclohexane, xylylene and diethylenebenzene. R and R' are particularly preferably longer-chain, branched alkylene with, for example, 8 to 30 C atoms.

An aliphatic radical R or R' in formula I can also be a polysiloxane radical of the formula

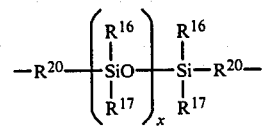

in which $R^{16}$ and $R^{17}$ are $C_1$–$C_6$-alkyl, in particular methyl, or phenyl, $R^{20}$ is cycloalkylene, for example cyclohexylene, or, in particular, $C_1$–$C_{12}$-alkylene, especially $C_1$–$C_6$-alkylene, for example 1,3-propylene or 1,4-butylene, x is a rational number of at least 1, for example 1 to 100, preferably 1 to 10. Such diamines containing this radical are described in U.S. Pat. Specification No. 3,435,002 and U.S. Pat. Specification No. 4,030,948.

Aliphatic radicals interrupted by heterocyclic radicals can be, for example, those derived from N,N'-aminoalkylated hydantoins or benzimidazoles. Examples are N,N'-(γ-aminopropyl)-5,5-dimethyl-hydantoin or -benzimidazolone, and those of the formula

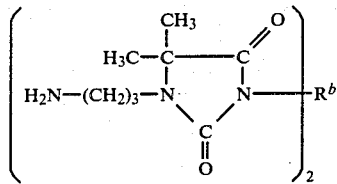

in which $R^b$ is alkylene with 1 to 12, preferably 1 to 4, C atoms or

in which $R^c$ is a hydrogen atom or methyl and a is an integer from 1 to 20.

Examples of suitable substituents for the aliphatic radicals are hydroxyl, halide, such as F or Cl, and alkoxy with 1 to 6 C atoms.

Heterocyclic diamine radicals are preferably derived from N-heterocyclic diamines, for example from pyrrolidine, indole, piperidine, pyridine or pyrrole, the N atom of which can be alkylated, for example methylated. An example is N-methyl-4-amino-5-aminomethyl-piperidine.

A divalent cycloaliphatic radical R or R' in formula I preferably contains 5 to 8 ring C atoms and is, in particular, mononuclear or dinuclear cycloalkylene which has 5 to 7 ring C atoms and is unsubstituted or substituted by alkyl, which preferably contains 1 to 4 C atoms. In a preferred embodiment, a cycloaliphatic radical R or R' is one of the formula

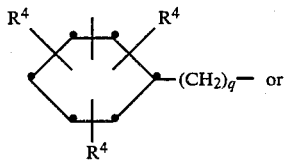

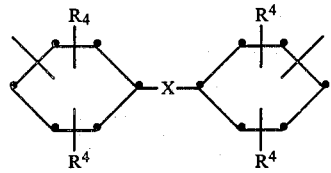

in which q is 0 or 1, the radicals $R^4$ independently one another are hydrogen or alkyl with 1 to 6 C atoms and X is a direct bond, O, S, $SO_2$, alkylene with 1 to 3 C atoms or alkylidene with 2 to 6 C atoms. $R^4$ is preferably ethyl or methyl, X is preferably methylene and the alkylidene radical preferably contains 2 or 3 C atoms and is, for example, ethylidene or 1,1- or 2,2-propylidene.

Examples of a cycloalkylene radical R or R' are: 1,2- or 1,3-cyclopentylene, 1,2-, 1,3- or 1,4-cyclohexylene, cycloheptylene, cyclooctylene, methylcyclopentylene, methyl- or dimethyl-cyclohexylene, 3- or 4-methylcyclohex-1-yl, 5-methyl-3-methylenecyclohex-1-yl, 3,3'- or 4,4'-bis-cyclohexylene, 3,3'-dimethyl-4,4'-biscyclohexylene, 4,4'-biscyclohexylene ether, -sulfone, -methane or -2,2-propane and the radicals of bis-aminomethyltricyclodecane, bis-aminomethylnorbornane and menthanediamine.

Particularly preferred cycloaliphatic radicals R and/or R' are 1,4- or 1,3-cyclohexylene, 2,2,6-trimethyl-6-methylene-cyclohex-4-yl, methylenebis(cyclohex-4-yl) and methylenebis(3-methylcyclohex-4-yl).

An araliphatic radical R or R' preferably contains 7 to 30 C atoms. If the aromatic group of the araliphatic radical is bonded to the N-atoms in the radical of the formula I, which is the preferred case, these aromatic groups are preferably substituted in the same way as an aromatic radical R or R', including the preferred substitutions. The araliphatic radical preferably contains 7 to 30, in particular 8 to 22, C atoms. The aromatic radical in the araliphatic radical is preferably a phenyl radical. An araliphatic radical R or R' is, in particular, aralkylene which is unsubstituted or substituted by alkyl on the aryl radical, the alkylene radical being linear or branched. In a preferred embodiment, the araliphatic radical has the formula

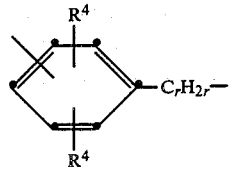

in which the radicals $R^4$ independently of one another are hydrogen atoms or, in particular, alkyl with 1–6 C atoms and r is an integer from 1 to 20.

The free bond can be in the o-position, m-position or, in particular, p-position relative to the $C_rH_{2r}$ group and one or both of the radicals $R^4$ are preferably bonded in the o-position relative to the free bond.

Examples of an araliphatic radical R or R' are: m- or p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylenepropylene, 3-methyl-p-phenylene-propylene, p-phenylenebutylene, 3-ethyl-p-phenylenepentylene and, in particular, longer-chain phenylenealkylene radicals, which are described, for example, in European Patent A-0,069,062: 6-(p-phenylene)-6-methylhept-2-yl, 6-(3'-methyl-p-phenylene)-6-methylhept-2-yl, 6-(3'-ethyl-p-phenylene)-6-methylhept-2-yl, 6-(3',5'-dimethyl-p-phenylene-6-methylhept-2-yl, 11-(p-phenylene)-2,11-dimethyl-dodec-1-yl and 13-(p-phenylene)-2,12-dimethyltetradec-3-yl.

R and/or R' can also be an aromatic radical in which two aryl nuclei, in particular phenyl, are linked via an aliphatic group. This radical preferably has the formula

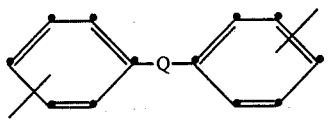

in which the free bonds are in the p-, m- or, in particular, o-position relative to the Q group and Q is $C_1$-$C_{12}$-alkylene, in particular $C_1$-$C_6$-alkylene, which can be interrupted by O or S. Examples of Q are ethylene, 1,2- or 1,3-propylene, butylene, $-CH_2-O-CH_2$, $-CH_2-S-CH_2-$ and $-CH_2CH_2-O-CH_2CH_2-$.

Particularly preferred homopolymers and copolymers are those with structural elements of the formula I in which R and/or R' are substituted aromatic radicals. The substituent on the aromatic radical preferably contains 1 to 20, in particular 1-12 and especially 1-6, C atoms. The substituent is, in particular, $C_5$- or $C_6$-cycloalkyl, linear or branched alkyl, alkoxy, alkoxyalkyl, alkylthio, alkylthioalkyl, hydroxyalkyl, hydroxyalkoxy or hydroxyalkylthio with 1 to 6 C atoms, benzyl, trimethylene or tetramethylene. Alkoxymethyl is the preferred alkoxyalkyl radical and methoxy is the preferred alkoxy radical. Examples of the substituents are: methyl, ethyl, propyl, isopropyl, n-butyl, isobutyl, pentyl, hexyl, octyl, dodecyl, tetradecyl, eicosyl, methoxy, ethoxy, propoxy, butoxy, pentoxy, hexoxy, methoxymethyl, methoxyethyl, ethoxymethyl, propoxymethyl, butoxymethyl, benzyl, methylbenzyl, phenethyl, methylthio, ethylthio, hydroxyethyl, methylthioethyl and hydroxyethylthio. Preferred radicals are methoxymethyl, ethoxymethyl, methyl, ethyl, n-propyl, i-propyl, trimethylene, tetramethylene, cyclopentyl and cyclohexyl. Methyl, ethyl and i-propyl are particularly preferred. The substituted aromatic radical can be a mononuclear or polynuclear, in particular a dinuclear, radical. Mononuclear radicals can contain up to 4, preferably 2 and in particular 1, substituents and dinuclear radicals can contain up to 4, preferably 1 or 2, substituents in each nucleus. It has been found that the photosensitivity of homopolymers or copolymers is particularly high if one or two substituents are bonded in the ortho-position relative to the N atom. Substitution in the ortho-position is thus preferred. The aromatic radical is preferably bonded in the meta- or para-position relative to the N atom.

An aromatic radical R or R' can contain 7 to 30, in particular 7 to 20, C atoms. The aromatic radical is preferably a hydrocarbon radical or a pyridine radical, which is substituted as defined above.

A preferred sub-group are those aromatic radicals of the formulae

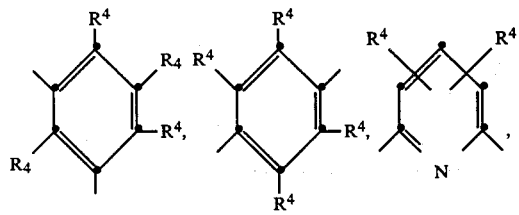

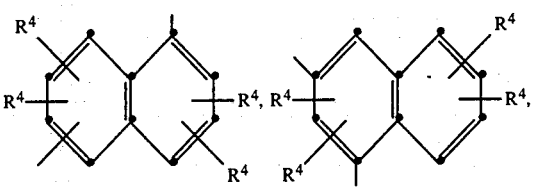

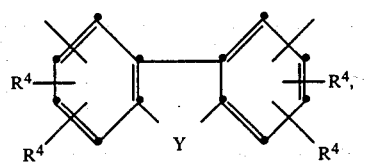

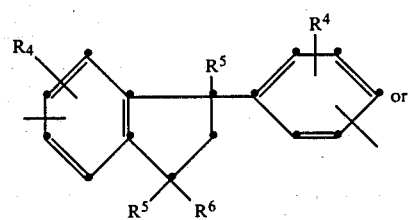

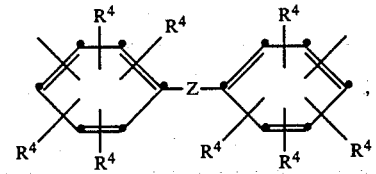

in which, in the case of monosubstitution, one radical $R^4$ is alkyl with 1 to 6 C atoms and the other radicals $R^4$ are hydrogen, and in the case of di-, tri- or tetra-substitution, two radicals $R^4$ are alkyl with 1 to 6 C atoms and the other radicals $R^4$ are hydrogen atoms or alkyl with 1 to 6 C atoms, or in the case of di-, tri- or tetra-substitution, two vicinal radicals $R^4$ in the phenyl ring are trimethylene or tetramethylene and the other radicals $R^4$ are hydrogen atoms or alkyl with 1 to 6 C atoms, Y is O, S, NH, CO or $CH_2$, $R^5$ is a hydrogen atom or alkyl with 1 to 5 C atoms, $R^6$ is alkyl with 1 to 5 C atoms and Z is a direct bond, O, S, SO, $SO_2$, CO,

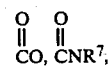

$NR^7$, CONH, NH, $R^7SiR^8$, $R^7OSiOR^8$,

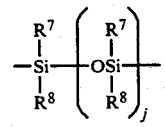

alkylene with 1 to 6 C atoms, which can be interrupted by —O— or —S—, or is alkenylene or alkylidene with 2 to 6 C atoms, phenylene or phenyldioxy, in which $R^7$ and $R^8$ independently of one another are alkyl with 1 to 6 C atoms or phenyl and j is 1-10, in particular 1-3. Z can also have the formula

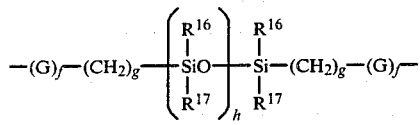

in which G is S or, in particular, 0, f is 0 or, in particular, 1, g is 1–6, h is 1 to 50, in particular 1 to 10, and $R^{16}$ and $R^{17}$ are as defined above, or can be a radical of the formula

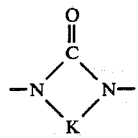

in which K is

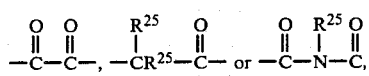

in which $R^{25}$ is H, $C_1$–$C_6$-alkyl or phenyl. $R^5$ and $R^6$ are preferably methyl, Y is preferably —$CH_2$— or —O— and Z is preferably a direct bond, —O—, —$CH_2$— or alkylidene with 2 to 4 C atoms. $R^7$ and $R^8$ are, in particular, methyl, ethyl or phenyl. The alkylene radical preferably contains 2 to 4 C atoms and is, in particular, ethylene. Alkenylene is, in particular, ethenylene.

A preferred sub-group are toluylene radicals and radicals of O,O'-substituted diaminodiphenylenes, diaminodiphenylmethanes and diaminodiphenyl ethers.

A particularly preferred group are those aromatic radicals of the formulae

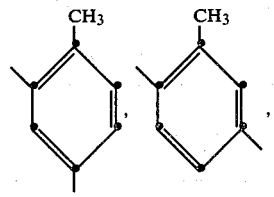

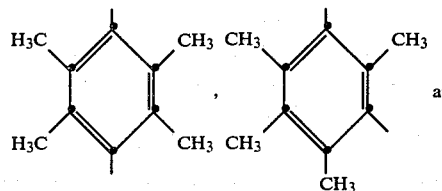

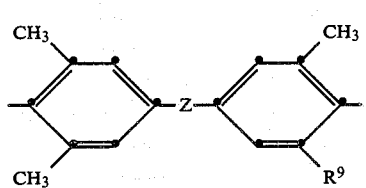

in which Z is a direct bond, 0 or, in particular, $CH_2$ and $R^9$ is a hydrogen atom, methyl, ethyl or isopropyl.

Examples of substituted aromatic radicals are: 4-methyl-1,3-phenylene, 4-ethyl-1,3-phenylene, 2-methyl-1,3-phenylene, 4-benzyl-1,3-phenylene, 4-methoxymethyl-1,3-phenylene, tetrahydro-1,3- or -1,4- naphthylene, 3-propyl-1,3-or -1,4-phenylene, 3-isopropyl-1,4-phenylene, 3,5-dimethyl-1,4-phenylene, 2,4-dimethyl-1,3-phenylene, 2,3-dimethyl-1,4-phenylene, 5-methyl-1,3-phenylene, 2,3,5,6-tetramethyl-1,4- or -1,3-phenylene, 3-methyl-2,6-pyridylene, 3,5-dimethyl-2,6-pyridylene, 3-ethyl-2,6-pyridylene, 1-methyl-2,7-naphthylene, 1,6-dimethyl-2,7-naphthylene, 1-methyl-2,4-naphthylene, 1,3-dimethyl-2,4-naphthylene, the divalent radicals of 5-amino-1-(3'-amino-4'-methylphenyl)-1,3,3-trimethylindane or 6-amino-5-methyl-1-(3'-amino-4'-methyl)-1,3,3-trimethylindane, 4-methoxymethyl-1,3-phenylene, 3-methyl-p-diphenylene 3- ethyl-p-diphenylene, 3,3'-dimethyl-p-diphenylene, 3,3-diethyl-p-diphenylene, 3-methyl-3'-ethyl-p-diphenylene, 3,3', 5,5'-tetramethyl-diphenylene, 3,3'-methyl-5,5'-ethyl-p-diphenylene, 4,4'-dimethyl-m-diphenylene, 3,3'-diisopropyldiphenylene and radicals of the formulae

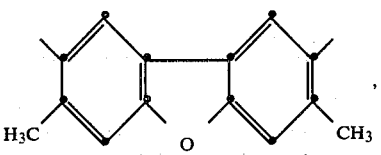

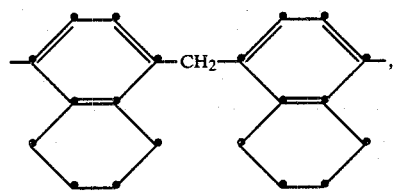

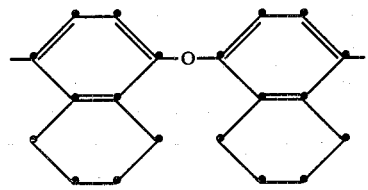

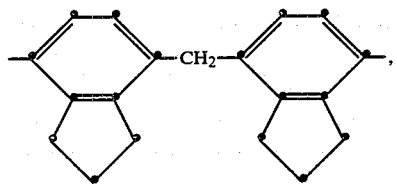

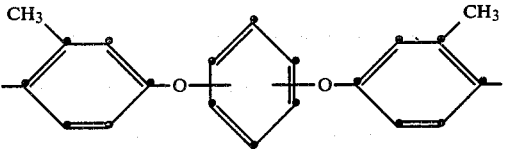

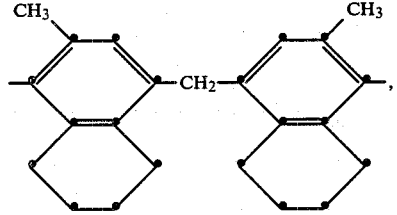

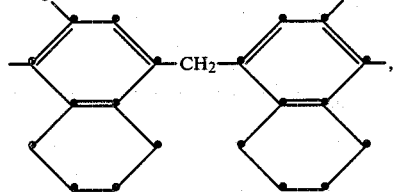

-continued

[structural formulas showing: diphenyl sulfide with fused rings; bis(methyl-substituted phenyl)methane with fused rings; diphenyl ketone with fused rings, as well as]

[phenyl-Z'-phenyl structures with R11, R12, R13, R14 substituents]

in which Z', $R^{11}$, $R^{12}$, $R^{13}$ and $R^{14}$ have the meanings given in the following table:

| Z' | $R^{11}$ | $R^{12}$ | $R^{13}$ | $R^{14}$ |
|---|---|---|---|---|
| $CH_2$ | Methyl | Methyl | — | — |
| $CH_2$ | Methyl | Ethyl | — | — |
| $CH_2$ | Ethyl | Ethyl | — | — |
| $CH_2$ | Isopropyl | Isopropyl | — | — |
| $CH_2$ | Methoxymethyl | Methoxymethyl | — | — |
| $CH_2$ | Benzyl | Benzyl | — | — |
| $CH_2$ | Methyl | Methyl | H | H |
| $CH_2$ | Ethyl | Ethyl | H | H |
| $CH_2$ | Isopropyl | Isopropyl | H | H |
| $CH_2$ | Methoxymethyl | Methoxymethyl | H | H |
| $CH_2$ | Methyl | Ethyl | H | H |
| $CH_2$ | Methoxymethyl | Methoxymethyl | Methoxymethyl | Methoxymethyl |
| $CH_2$ | Methyl | Methyl | Methyl | Methyl |
| $CH_2$ | Ethyl | Ethyl | Ethyl | Ethyl |
| $CH_2$ | Methyl | Methyl | Ethyl | Ethyl |
| $CH_2$ | Ethyl | Ethyl | Isopropyl | Isopropyl |
| $CH_2$ | Isopropyl | Isopropyl | Isopropyl | Isopropyl |
| $CH_2$ | Isopropyl | Isopropyl | H | H |
| $CH_2$ | Methoxy | Methoxy | H | H |
| O | Methyl | Methyl | — | — |
| O | Ethyl | Ethyl | — | — |
| O | Methyl | Methyl | H | H |
| O | Methyl | Methyl | Methyl | Methyl |
| O | Methyl | Methyl | Ethyl | Ethyl |
| S | Methyl | Methyl | — | — |
| S | Ethyl | Ethyl | — | — |
| S | Methyl | Methyl | H | H |
| S | Methyl | Methyl | Methyl | Methyl |
| S | Ethyl | Ethyl | Ethyl | Ethyl |
| S | Methyl | Methyl | Ethyl | Ethyl |
| CO | Methyl | Methyl | — | — |
| CO | Methyl | Methyl | H | H |
| CO | Methyl | Methyl | Methyl | Methyl |
| $SO_2$ | Methyl | Methyl | — | — |
| $SO_2$ | Methyl | Methyl | H | H |
| $SO_2$ | Methyl | Methyl | Methyl | Methyl |
| $SO_2$ | Ethyl | Ethyl | Methyl | Methyl |
| SO | Methyl | Methyl | — | — |
| SO | Methyl | Methyl | H | H |
| COO | Methyl | Methyl | H | H |
| COO | Methyl | Methyl | Methyl | Methyl |
| $CONCH_3$ | Methyl | Methyl | H | H |
| $NCH_3$ | Methyl | Methyl | — | — |
| $NCH_3$ | Methyl | Methyl | Methyl | Methyl |
| CONH | Methyl | Methyl | — | — |
| NH | Ethyl | Ethyl | H | H |
| NH | Methyl | Methyl | — | — |
| $Si(Methyl)_2$ | Methyl | Methyl | — | — |
| $Si(Phenyl)_2$ | Methyl | Methyl | Methyl | Methyl |
| $Si(OMethyl)_2$ | Ethyl | Ethyl | — | — |
| $Si(OPhenyl)_2$ | Methyl | Methyl | H | H |
| Ethylene | Methyl | Methyl | — | — |
| Ethylene | Methyl | Methyl | Methyl | Methyl |
| Ethylene | Ethyl | Ethyl | H | H |
| Ethylene | Methyl | Methyl | — | — |
| Phenylene | H | H | Methyl | Methyl |
| Phenylene | Alkyl | Alkyl | — | — |
| $(CH_3)_2C\diagup\diagdown$ | Methyl | Methyl | H | H |
| $(CH_3)_2C\diagup\diagdown$ | Methyl | Methyl | Methyl | Methyl |
| $(CF_3)_2C\diagup\diagdown$ | Methyl | Methyl | Methyl | Methyl |

The diamines from which R and R' are derived are known or they can be prepared by known processes. Diamines with polysiloxane units are known from U.S. Pat. No. 3,435,002 and from European Patent A-0,054,426.

The polymers to be used according to the invention have average molecular weights (number-average) of at least 2,000, preferably at least 5,000. The upper limit essentially depends on properties which determine the processability, for example the solubility of the polymers. It can be up to 500,000, preferably up to 100,000 and in particular up to 60,000. The polymers can furthermore be random polymers or block polymers. They are prepared by conventional processes in equipment envisaged for this purpose. The polymers are preferably built up in a linear manner, but can also be slightly branched with at least trifunctional monomers, which are added in small amounts.

The homopolymers or copolymers are preferably chosen from the group comprising polyimides, polyamides, saturated polyesters, polycarbonates, polyamide-imides, polyesterimides, polyester-amides, polysiloxanes, unsaturated polyesters, epoxy resins, the aromatic polyethers, the aromatic polyether-ketones, the aromatic polyether-sulfones, the aromatic polyketones, the aromatic polythioethers, the aromatic polyimidazoles and the aromatic polypyrrones, and mixtures of these polymers.

Very particularly preferred amongst these polymers is a polyimide with recurring structural elements of the formula I in which q is 0, or a copolyimide of recurring structural elements of the formula I in which q is 0 and recurring structural elements of the formula II

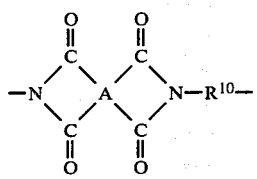

(II)

in which A is a tetravalent organic radical and $R^{10}$ is a divalent organic radical.

In the homopolyimides and copolyimides, R and $R^{10}$ are, in particular, aromatic organic radicals. Particularly preferred copolyimides are those which contain at least 60 mol %, preferably 80 mol %, of structural elements of the formula I.

A radical A in formula II which is not a benzophenone radical can be selected from the following groups: aromatic, aliphatic, cycloaliphatic and heterocyclic groups, and combinations of aromatic and aliphatic groups. The groups can also be substituted. The groups A can have the following structures:

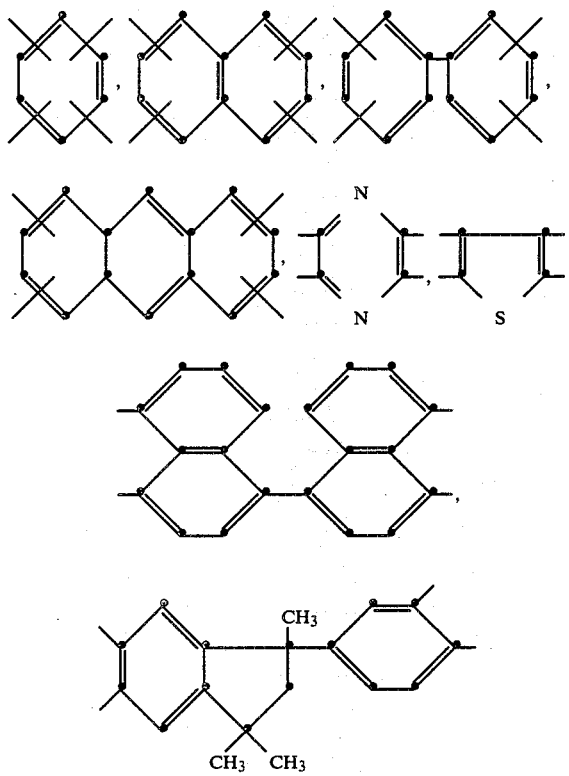

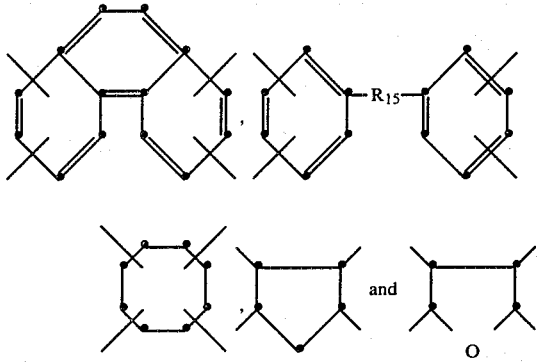

-continued

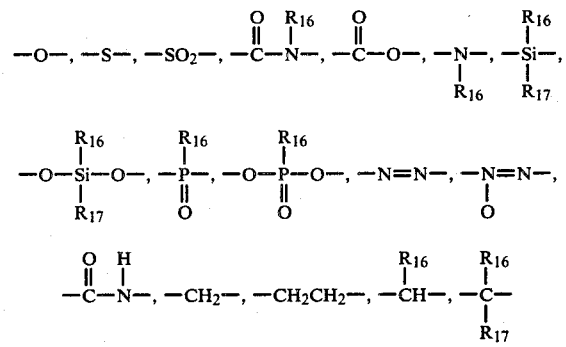

in which $R^{15}$ is chosen from the group consisting of $-O-$, $-S-$, $-SO_2-$, $-\overset{O}{\underset{}{C}}-\overset{R_{16}}{\underset{}{N}}-$, $-\overset{O}{\underset{}{C}}-O-$, $-\overset{R_{16}}{\underset{R_{16}}{N}}-$, $-\overset{R_{16}}{\underset{R_{17}}{Si}}-$, $-O-\overset{R_{16}}{\underset{R_{17}}{Si}}-O-$, $-\overset{R_{16}}{\underset{O}{P}}-$, $-O-\overset{R_{16}}{\underset{O}{P}}-O-$, $-N=N-$, $-\overset{}{\underset{O}{N}}=N-$, $-\overset{O}{\underset{}{C}}-\overset{H}{\underset{}{N}}-$, $-CH_2-$, $-CH_2CH_2-$, $-\overset{R_{16}}{\underset{}{CH}}-$, $-\overset{R_{16}}{\underset{R_{17}}{C}}-$ phenylene and $-O\text{-}(R^d\text{-}O)_b$, in which b is 1–10 and $R^d$ is alkylene, cycloalkylene, arylene or aralkylene, and in which $R^{16}$ and $R^{17}$ are alkyl with preferably 1 to 6 C atoms or aryl, in particular phenyl. Of the free bonds in the above formulae, two are always on vicinal C atoms.

Examples of suitable tetracarboxylic acid anhydrides or esters thereof with a tetravalent radical A are: 2,3,9,10-perylenetetracarboxylic acid dianhydride, 1,4,5,8-naphthalenetetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, phenanthrene-1,8,9,10-tetracarboxylic acid dianhydride, pyromellitic acid dianhydride, 3,3', 4,4'-biphenyltetracarboxylic acid dianhydride, 2,2',3,3'-biphenyltetracarboxylic acid dianhydride, 4,4'-isopropylidenediphthalic anhydride, 3,3'-isopropylidenediphthalic anhydride, 4,4'-oxydiphthalic anhydride, 4,4'-sulfonyldiphthalic anhydride, 3,3'-oxydiphthalic anhydride, 4,4'-methylenediphthalic anhydride, 4,4'-thiodiphthalic anhydride, 4,4'-ethylidenediphthalic anhydride, 2,3,6,7-naphthalenetetracarboxylic acid dianhydride, 1,2,4,5-naphthalenetetracarboxylic acid dianhydride, 1,2,5,6-naphthalenetetracarboxylic acid dianhydride, benzene-1,2,3,4-tetracarboxylic acid dianhydride, thiophene-2,3,4,5-tetracarboxylic acid dianhydride, 1-(3',4'-dicarboxyphenyl)-1,3,3-trimethylindane-5,6-dicarboxylic acid dianhydride, 1-(3',4'-dicarboxyphenyl)-1,3,3-trimethylindane-6,7-dicarboxylic acid dianhydride, 1-(3',4'-dicarboxyphenyl)-3-methylindane-5,6dicarboxylic acid dianhydride, tetrahydrofurantetracarboxylic acid dianhydride, cyclopentanetetracarboxylic acid dianhydride, cyclooctanetetracarboxylic acid dianhydride and 1-(3',4'-dicarboxyphenyl)-3-methylindane- 6,7-dicarboxylic acid dianhydride and dianhydrides of the general formula

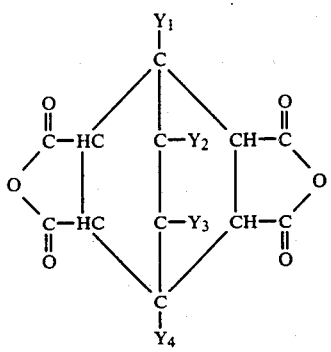

in which $Y_1$, $Y_2$, $Y_3$ and $Y_4$ are each selected from hydrogen and alkyl, in particular methyl.

The most preferred aromatic dianhydrides which do not contain benzophenone radicals are pyromellitic dianhydride and aromatic dianhydrides which have the general formula

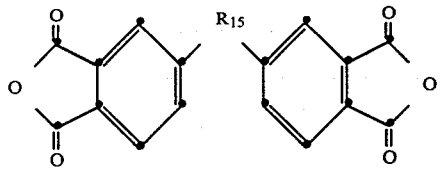

in which $R_{15}$ is methylene, oxygen, sulfonyl or

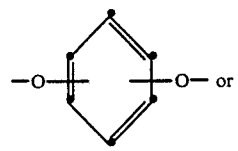

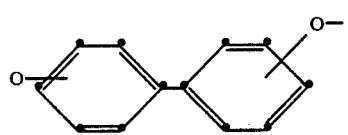

The group $R^{10}$ defined above can be selected from alkylene groups with 2 to 20 carbon atoms, cycloalkylene groups with 4 to 6 ring carbon atoms, a xylylene group, arylene groups selected from meta- or para-phenylene, tolylene, biphenylene, naphthylene and anthrylene, and an unsubstituted or substituted arylene group of the formula

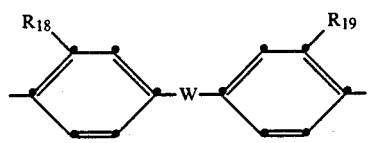

in which W is a covalent bond, sulfur, carbonyl, —NH, —N—alkyl, O, S, SS, —N-phenyl, sulfonyl, a linear or branched alkylene group with 1 to 3 carbon atoms, alkylidene with 2 to 12 C atoms, cycloalkylidene with 5 or 6 ring carbon atoms, arylene, in particular the phenylene group, or a dialkyl- or diaryl-silyl group and $R_{18}$ and $R_{19}$ independently of one another are each hydrogen, halogen, in particular chlorine or bromine, alkyl with 1 to 5 carbon atoms, in particular methyl, alkoxy with 1 to 5 carbon atoms, in particular methoxy, or aryl, in particular phenyl.

$R^{10}$ more preferably is a group derived from one of the aromatic diamines which have been described above. $R^{10}$ is most preferably a group of the formula

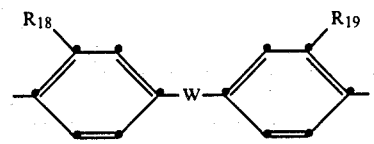

in which W is a covalent bond, methylene, sulfur, oxygen or sulfone and $R_{18}$ and $R_{19}$ independently of one another are hydrogen, halogen or alkyl with 1 to 5 carbon atoms, in particular methyl, or a group of the formula

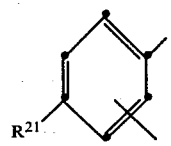

in which $R^{21}$ is hydrogen, halogen or alkyl with 1 to 5 carbon atoms, in particular methyl.

$R^{10}$ is particularly preferably meta- or para-phenylene or a radical of the formula

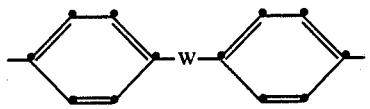

in which W is a covalent bond, methylene, 2,2-propylidene, cyclohexylidene, sulfur, oxygen or sulfone.

Examples of diamines with a divalent radical $R^{10}$ are: 4,4'-methylenebis-(o-chloroaniline), 3,3'-dichlorobenzidine, 3,3'-sulfonyldianiline, 4,4'-diaminobenzophenone, 1,5-diaminonaphthalene, bis-(4-aminophenyl)-dimethylsilane, bis-(4-aminophenyl)-diethylsilane, bis-(4-aminophenyl)-diphenylsilane, bis-(4-aminophenyloxy)-dimethylsilane, bis-(4-aminophenyl)-ethylphosphine oxide, N-[bis-(4-aminophenyl)]-N-methylamine, N-[bis-(4-aminophenyl)]-N-phenylamine, 4,4'-methylenebis-(3-methylaniline), 4,4'-methylenebis-(2-ethylaniline), 4,4'-methylenebis-(2-methoxyaniline), 5,5'-methylenebis-(2-aminophenol), 4,4'-methylenebis-(2-methylaniline), 4,4'-oxybis-(2-methoxyaniline), 4,4'-oxybis-(2-chloroaniline), 5,5'-oxybis-(2-aminophenol), 4,4'-thiobis-(2-methylaniline), 4,4'-thiobis-(2-methoxyaniline), 4,4'-thiobis-(2-chloroaniline), 4,4'-sulfonylbis-(2-methylaniline), 4,4'-sulfonylbis-(2-ethoxyaniline), 4,4'-sulfonylbis-(2-chloroaniline), 5,5'-sulfonylbis-(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, p-phenylenediamine, 4,4'-methylenedianiline, 4,4'-oxydianiline, 4,4'-thiodianiline, 4,4'-sulfonyldianiline, 4,4'-isopropylidenedianiline, 3,3'-dimethylbenzidine, 3,3'-dimethoxybenzidine, 3,3'-dicarboxybenzidine, diaminotoluene, 4,4'-methylene-bis-(3-carboxyaniline) and esters thereof.

The homopolyimides and copolyimides are prepared in the customary manner, by reaction of benzophenonetetracarboxylic acid anhydride with diamines of the formula NH₂RNH₂, if appropriate together with other tetracarboxylic acid anhydrides of the formula

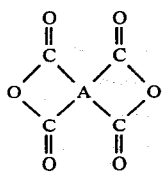

and/or other diamines of the formula NH₂R¹⁰NH₂, and subsequent imide cyclisation under the action of carboxylic acid anhydrides and/or subsequent heating. In another known process, diisocyanates are reacted with tetracarboxylic acid dianhydrides to give polyimides.

The other chosen homopolymers and copolymers are prepared starting from functional imide derivatives of benzophenonetetracarboxylic acid. They can have the formula III

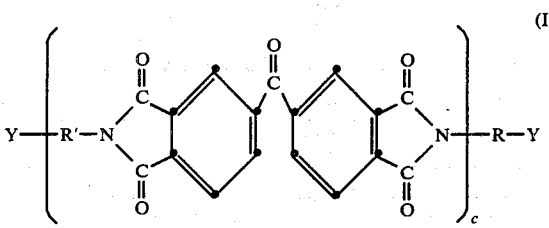

in which R and R' are as defined above, c is a number from 1 to about 500 and Y is a functional group. Examples of such functional groups can be: NHR²², OH, SH, O-acyl, COOR²², CON(R²²)₂, COCl, COBr,

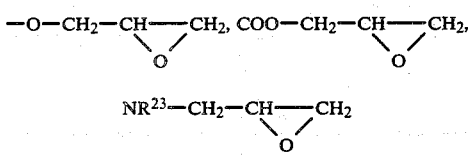

and halogen, in particular Cl and Br. R²² is a hydrogen atom or a hydrocarbon radical, which may or may not be hydroxylated, for example alkyl or hydroxyalkyl with preferably 1-20, in particular 1-12, C atoms, aralkyl with preferably 7-20, in particular 7-16, C atoms, aryl with preferably 6-20, in particular 6-16, C atoms or cycloalkyl with preferably 5-7 ring C atoms. R²³ can have the same meaning as R²² or can be

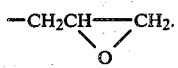

The acyl group can contain 1 to 20, preferably 1-12, C atoms.

The compounds of the formula III in which c is 1 are known in some cases from German Offenlegungsschrift No. 3,007,445, or they can be prepared by analogous processes. Further functional groups, for example the glycidyl group, are introduced by customary processes.

The compounds of the formula III in which c>1 are novel and the invention likewise relates to these compounds. These are oligomeric and low-molecular polyimides with functional end groups. They are obtained by processes analogous to those for polyimides, the size of c being determined by the amount of monomers of the formula Y—R—NH₂ also used. Block polymers with polyimide blocks and, for example, polyamide, polyester or other polyimide blocks are obtained, for example, with these oligomers and low-molecular polymers.

A further preferred group of polymers for the material according to the invention are polyamides or copolyamides of organic diamines, dicarboxylic acids, ω-aminocarboxylic acids and diamines or dicarboxylic acids with structural elements of the formula I, in which q is 1 and in which amine groups or carboxyl groups are bonded to the R and R' groups, and mixtures of the monomers.

The homopolymers can be those in which the molecular chains are built up from dicarboxylic acids and diamines with structural elements of the formula I, or those in which the molecular chains are built up from dicarboxylic acids or diamines with structural elements of the formula I and organic diamines or dicarboxylic acids, which contain no benzophenone radicals. The copolyamides contain other diamine or dicarboxylic acid radicals or aminocarboxylic acid radicals.

Examples of suitable dicarboxylic acids are linear or branched aliphatic dicarboxylic acids with preferably 2 to 20, in particular 4 to 16, C atoms, cycloaliphatic dicarboxylic acids which have 5 to 7 ring C atoms and are unsubstituted or, in particular, substituted by alkyl, and aromatic dicarboxylic acids which preferably have 8 to 22 C atoms and are unsubstituted or substituted, for example by alkyl, Cl or bromine. Examples are: malonic acid, adipic acid, trimethyladipic acid, pimelic acid, suberic acid, azelaic acid, dodecanedicarboxylic acid, the cyclohexanedicarboxylic acids, isophthalic acid, terephthalic acid, p-diphenyldicarboxylic acid, bis-(4-carboxyphenyl) ether and bis-(4-carboxyphenyl) sulfone.

Examples of suitable diamines are linear or branched aliphatic diamines with preferably 2 to 30, in particular 4 to 20, C atoms, cycloaliphatic diamines which have preferably 5 to 7 ring C atoms and are unsubstituted or substituted by alkyl, in particular methyl, araliphatic diamines with preferably, 7 to 24 C atoms and aromatic diamines with 6 to 22, preferably 6 to 18, C atoms, which can be unsubstituted or, in particular, substituted by alkyl. Examples are: ethylenediamine, propylenediamine, 1,3- or 1,4-butylenediamine, pentylenediamine, 1,6-hexylenediamine, octylenediamine, decylenediamine, dodecylenediamine, 1,10-alkyl-substituted 1,10-decylenediamines, for example 1,10-dimethyl-1,10-decylenediamine or 1,10-di-n-hexyl-1,10-decylenediamine, xylylenediamine, isophoronediamine, 1,3- or 1,4-cyclohexanediamine, 1,3- or 1,4-phenylenediamine, methylphenylene-diamine, toluylenediamine, p-biphenylenediamine, bis-(p-aminophenyl) ether, bis-(p-aminophenyl) sulfone and bis-(p-aminophenyl)methane.

The aminocarboxylic acids can be aromatic, cycloaliphatic or aliphatic aminocarboxylic acids, for example aminobenzoic acid, aminocyclohexanecarboxylic acid and ω-aminocarboxylic acids, such as ε-aminocaproic acid or 11-aminoundecanoic acid.

A further preferred group of polymers for the material according to the invention are polyesters or copolyesters of organic diols, dicarboxylic acids, hydroxycarboxylic acids and diols or dicarboxylic acids with structural elements of the formula I in which q is 1 and in which hydroxyl or carboxyl groups are bonded to the R and R' groups, and mixtures of the monomers.

The homopolyesters can be those in which the molecular chains are built up from diols and dicarboxylic acids of the formula III, or those in which the molecular chains are built up from dicarboxylic acids or diols of the formula III and organic diols or dicarboxylic acids containing no benzophenone radicals. The copolyesters contain other radicals of dicarboxylic acids, diols and/or hydroxycarboxylic acids.

Suitable dicarboxylic acids have been mentioned above. Polyesters based on aromatic dicarboxylic acids, in particular terephthalic acid and/or isophthalic acid, are preferred. Suitable diols are cycloaliphatic diols, such as 1,4-cyclohexanediol, aromatic diols, such as bisphenol A, and, in particular, unsubstituted or substituted aliphatic diols, such as branched and, in particular, linear alkylenediols with, for example, 2 to 12, preferably 2 to 6, C atoms, as well as 1,4-bis-hydroxymethylcyclohexane and neopentylglycol hydroxypivalate. Ethylene glycol, trimethylene glycol, tetramethylene glycol and hexamethylene glycol are particularly preferred. Examples of suitable hydroxycarboxylic acids are m- or p-hydroxybenzoic acid and aliphatic ω-hydroxycarboxylic acids, for example γ-hydroxyvaleric acid, hydroxypivalic acid and ε-caprolactone.

In another preferred embodiment, the polymers for the material according to the invention are polyamide-imides or polyester-imides. Such polymers can be obtained by incorporation of tricarboxylic acids of the formula IV or polymerforming derivatives thereof, such as the ester, anhydride or acid halide:

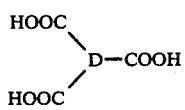

IV

The trivalent radical can be a hydrocarbon radical which preferably has 6 to 16 C atoms and in which two carboxyl groups are bonded to two adjacent C atoms. Trimellitic acid is preferred.

The polyamide-imides can be built up only from diamines of the formula III and tricarboxylic acids of the formula IV. Copolymers are obtained if dicarboxylic acids and/or diamines, for example those which have been mentioned above for the polyamides, are additionally also used in the preparation of the polyamide-imides, including those of the formula III.

Polyester-imides can be obtained if an aminocarboxylic acid or an aminoalcohol is first reacted with tricarboxylic acids of the formula IV to give dicarboxylic acids or hydroxycarboxylic acids, and these are then further subjected to a polycondensation reaction with diols and/or dicarboxylic acids of the formula III to give polyesters. Other dicarboxylic acids and/or diols can also additionally be used here for the preparation of copolymers.

Furthermore, polyester-amides are also preferred. These polymers are obtained when dicarboxylic acids of the formula III and/or other dicarboxylic acids are subjected to a polycondensation reaction with diols of the formula III and/or other diols and diamines of the formula III and/or other diamines, the individual monomers having already been mentioned above.

The N atoms of the amide groups in the polymers mentioned above can be substituted by alkyl with preferably 1 to 6 C atoms, aryl, for example phenyl, aralkyl, for example benzyl, or cycloalkyl, for example cyclohexyl.

Examples of other suitable polymers for the coated material according to the invention are:

(a) Polysiloxanes of diols of the formula III and, if appropriate, other diols, and silanes of the formula $(R^{24})_2SiB_2$, in which $R^{24}$ is preferably alkyl with 1 to 6 C atoms, in particular methyl, or cycloalkyl, in particular phenyl, and B is Br or, in particular, Cl, or alkoxy or aryloxy with preferably 1 to 6 C atoms, in particular methoxy or phenoxy. These polymers can thus contain structural elements of the formula

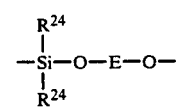

and, if appropriate, of the formula

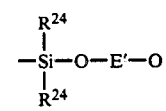

in which E is the radical of the formula I in which q is 1, and E' is the divalent radical of a diol. Suitable diols HOE'OH have already been mentioned above. These polymers can also additionally contain blocks with structural elements of the formula

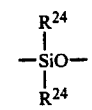

it being possible for these blocks to amount to up to 50 mol %, based on the polymer.

(b) Unsaturated polyesters of unsaturated dicarboxylic acids, in particular maleic acid, and diols of the formula I (HOEOH) and, if appropriate, other dicarboxylic acids, also of the formula I, and other diols HOE'OH. Suitable dicarboxylic acids have already been mentioned above. These polymers can thus contain structural elements of the formula

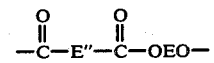

in which E'' is the divalent radical of an ethylenically unsaturated dicarboxylic acid. Other structural elements which the polyesters can contain are

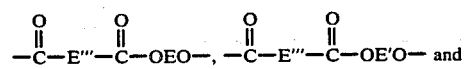

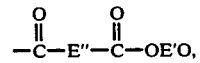

in which E''' is the divalent radical of a dicarboxylic acid of the formula I or of another dicarboxylic acid.

These polymers can additionally be polymerised by heat in the presence of customary polymerisation catalysts as a result of the presence of the ethylenically unsaturated groups, reactive diluents, such as styrene, also being present, if appropriate.

(c) Suitable epoxy resins can be obtained in various ways. Thus, the epoxide compounds of the formula III can be reacted catalytically, for example with tertiary amines, by themselves or together with other polyepoxide compounds with more than one epoxy group in the molecule, to give polyethers, or they can be reacted with the customary hardeners, such as polyols, polycarboxylic acids and anhydrides thereof, or polyamines. The diamines, diols and dicarboxylic acids of the formula III can also be used as hardeners, in which case it is then also possible to use only customary polyepoxide compounds without benzophenonetetracarboxylic acid radicals. The epoxy resins can be used as prepolymers which can be hardened by heat after the irradiation.

(d) Aromatic polyethers can be obtained, for example, by reacting compounds of the formula III in which Y is OH or halogen, in particular Br or Cl, and R and R' are aromatic radicals, with phenyl-aromatic dichlorides or bromides or diols. Examples of suitable halides and diols are mononuclear or dinuclear phenyl-aromatic derivatives, such as hydroquinone, p-dichloro- or p-dibromo-phenylene, p-dihydroxyphenylene, p-dichloro- or p-dibromo-diphenylene, bis-(p-hydroxyphenyl) ether and bis-(p-chlorophenyl) ether.

The phenyl-aromatic radicals can contain further substituents, for example alkyl with preferably 1 to 4 C atoms. If dinuclear phenyl-aromatic radicals in which the phenyl groups are bonded to a sulfone group are used, polyethersulfones are obtained. Examples of such derivatives are bis-(p-chlorophenyl) sulfone and bis-(p-hydroxyphenyl) sulfone. Polyethers containing only structural elements of the formula I are obtained from compounds of the formula III in which Y is OH and compounds of the formula III in which Y is halogen.

(e) Aromatic polyketones can be obtained by reacting aromatic compounds of the formula III in which Y is H with aromatic acid halides of the formula III in which Y is an acid halide group, in particular an acid chloride group, in the presence of Lewis acids. Other aromatic, in particular phenyl-aromatic, compounds and/or aromatic, in particular phenyl-aromatic, dicarboxylic acid dihalides can additionally also be used. The aromatic compounds are preferably mononuclear or dinuclear phenyl-aromatics or dicarboxylic acid dihalide derivatives thereof. Examples are benzene, toluene, diphenyl, diphenylmethane, diphenyl ketone, diphenyl sulfone, diphenyl ether, terephthaloyl dichloride and 4,4'-chlorocarbonyl-diphenyl, -diphenylmethane, -diphenyl ether or -diphenyl sulfone. If the ether derivatives are used, polyether-ketones are obtained. The aromatic hydrocarbons and dicarboxylic acid dihalides can be substituted, for example by alkyl with 1 to 4 C atoms.

(f) Aromatic polythioethers can be obtained, for example, by reacting aromatic compounds of the formula III in which Y is halogen, such as Cl or, in particular, Br, with di-alkali metal sulfides, for example $Na_2S$.

Other aromatic, in particular phenyl-aromatic, dihalogen compounds, preferably chlorides or, in particular, bromides, can also additionally be used. Aromatic polysulfides can also be obtained by reacting aromatic compounds of the formula III in which Y is SH by themselves or together with other dimercaptans, in particular phenyl-aromatic dimercaptans, or, in particular, alkali metal salts thereof, for example the sodium salts, with compounds of the formula III in which Y is halogen, in particular Br, and/or other dihalides, in particular phenylaromatic dihalides, for example bromides. Such halides have already been mentioned above. Examples of suitable aromatic dimercaptans are 1,4-phenylenedimercaptan and p-biphenylenedimercaptan.

(g) Examples of other suitable polymers are those which can be obtained by reacting compounds of the formula III in which Y is OH, $NH_2$ or COOH with diisocyanates or diepoxides.

(h) Another group of suitable polymers are aromatic polyimidazoles. They can be obtained by reacting esters of the formula III, by themselves or together with other aromatic dicarboxylic acid diesters, and aromatic tetramines, for example 3,3',4,4'-tetraaminobiphenyl, to give polyamide intermediates, which are then subjected to a condensation reaction by heating to give the polyimidazoles.

(i) A further group of suitable polymers are aromatic polypyrrones. They can be obtained, for example, by reacting tetracarboxylic acid anhydrides of the formula V

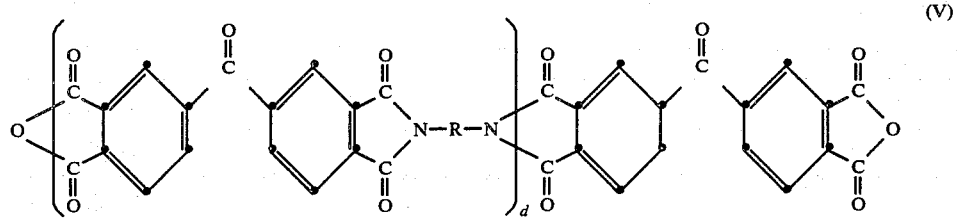

(V)

in which R is as defined above and d is a number from 1 to 500, with aromatic tetramines, for example 3,3',4,4'-tetraaminodiphenyl. In this reaction, soluble intermediates are first formed, and are subjected to a polycondensation reaction by heating to give polypyrrones. The compounds of the formula V can be obtained by reacting an excess of benzophenonetetracarboxylic acid dianhydride with diamines of the formula $H_2NRNH_2$. These compounds can also be used, for example, for the preparation of polyimides.

To produce the coated material according to the invention, the polymer or a mixture of the polymers is advantageously dissolved in a suitable organic solvent, if appropriate with warming. Examples of suitable solvents are polar, aprotic solvents, which can be used by themselves or in mixtures of at least two solvents. Examples are: ethers, such as dibutyl ether, tetrahydrofuran, dioxane, methylene glycol, dimethylethylene glycol, dimethyldiethylene glycol, diethyldiethylene glycol and dimethyltriethylene glycol, halogenated hydrocarbons, such as methylene chloride, chloroform, 1,2-dichloroethane, 1,1,1-trichloroethane and 1,1,2,2-tetrachloroethane, carboxylic acid esters and lactones, such as ethyl acetate, methyl propionate, ethyl benzoate, 2-methoxyethyl acetate, γ-butyrolactone, o-valerolactone and pivalolactone, carboxylic acid amides and lactams, such as formamide, acetamide, N-methylformamide, N,N-dimethylformamide, N,N-diethylformamide, N,N-dimethylacetamide, N,N-diethylacetamide, γ-butyrolactam, ε-caprolactam, N-methylpyrrolidone, N-acetylpyrrolidone, N-methylcaprolactam, tetramethylurea and hexamethylphosphoric acid amide, sulfoxides, such as dimethylsulfoxide, sulfones, such as dimethyl sulfone, diethyl sulfone, trimethylene sulfone and tetramethylene sulfone, trimethylamine, triethylamine, N-methylpyrrolidine, N-methylpiperidine, N-methylmorpholine and substituted benzenes, such as chlorobenzene, nitrobenzene, phenols or cresol. In the case of insoluble polymers, it is possible to use soluble intermediates, which are then irradiated, after the coating operation, and subsequently converted into the polymers by heating.

Undissolved constituents can be removed by filtration, preferably pressure filtration. The concentration of polymer in the coating agent thus obtained is preferably not more than 50% by weight, in particular not more than 30% by weight and especially not more than 20% by weight, based on the solution. Coating agents containing polymers with structural elements of the formula I in which R and also R' are aromatic radicals or araliphatic radicals substituted as defined are novel and the invention likewise relates to these coating agents.

Other customary additives which do not adversely affect the photosensitivity can be incorporated during the preparation of the solutions. Examples of these additives are delustering agents, flow control agents, fine-particled fillers, flameproofing agents, fluorescent brighteners, antioxidants, light stabilisers, stabilisers, dyes, pigments and adhesion promoters. Furthermore, if desired, sensitisers, for example thioxanthone derivatives or benzophenone derivatives, can also additionally be incorporated, in order to increase the photosensitivity still further, as well as antihalo dyes, for example those described in U.S. Pat. Specification No. 4,349,619.

The coating agent can be applied to suitable substrates or carrier materials by means of customary methods, such as dipping, brushing and spraying processes and whirler coating, cascade coating and curtain coating. Examples of suitable substrates are plastics, metals and metal alloys, semimetals, semiconductors, glass, ceramics and other inorganic materials, for example $SiO_2$ and $Si_3N_4$. After coating, the solvent is removed, if necessary by warming and if necessary in vacuo. Nontacky, dry, uniform films are obtained. The films applied can have coating thicknesses of up to about 500 μm or more, preferably of 0.5 to 500 μm and in particular of 1 to 50 μm, depending on their use.

The radiation-sensitive coating in the material according to the invention can be crosslinked by the action of radiation.

The photostructuring or photocrosslinking can be caused by high-energy radiation, for example by light, in particular in the UV range, by X-rays, laser light, electron beams and the like. The material according to the invention is outstandingly suitable for producing protective films and passivating lacquers and as a photographic recording material for heat-stable relief images. The invention also relates to this use. Examples of fields of use are protective, insulating and passivating lacquers in electrotechnology and electronics, photomasks for electronics, textile printing and the graphics industry, etch resists for the production of printed circuits and printing plates and integrated circuits, relays for the production of X-ray masks, solder-stopping lacquers, dielectrics for multilayer circuits and structural elements for liquid crystal displays.

Protective films are produced by direct exposure, the exposure times essentially depending on the coating thicknesses and the photosensitivity.

Photographic production of the relief structure is effected by image-wise exposure through a photomask, and subsequent development with a solvent or a solvent mixture, the non-exposed portions being removed, after which the image produced can be stabilised, if appropriate, by after-treatment with heat.

The invention furthermore relates to such a process for the application of relief structures. Suitable developers are, for example, the abovementioned solvents.

The polymer layer of the material according to the invention has a photosensitivity which is sufficient for many intended uses and in some cases is high, and it can be photocrosslinked directly. The protective films and relief images, especially those of polyimide coatings, are distinguished by a good adhesion and a high heat resistance, mechanical strength and resistance to chemicals. Only a slight shrinkage is observed on after-treatment with heat. Furthermore, additives to produce or increase the photosensitivity can be avoided. The material is stable on storage but should be protected from the effect of light.

The examples which follow illustrate the invention in more detail.

(A) Preparation of the starting substances

EXAMPLE 1

27.28 g (0.12 mol) of 4,4'-diamino-3,3'-dimethyldiphenylmethane are dissolved in 370 g of N-methylpyrrolidone (NMP) under nitrogen in a cylindrical vessel equipped with a stirrer, dropping funnel, internal thermometer and nitrogen inlet tube, and the solution is cooled to 0° to 5° C. 39.43 g (0.1225 mol) of benzophenonetetracarboxylic acid dianhydride (BTDA) are now prepared, and are added in portions in the course of 4 hours. 30 minutes after the last addition, 48.48 g (0.48 mol) of triethylamine and 110.1 g (1.08 mol) of acetic anhydride are added dropwise in order to cyclise the resulting polyamide acid to the polyimide. After the solution has been stirred at room temperature for 16 hours, it is poured onto 6 liters of water, with vigorous stirring, and the product which has precipitated out is filtered off. The product is again treated with 6 liters of water and filtered off, and is dried at 80° C. in vacuo. The intrinsic viscosity, measured as a 0.5% strength solution in NMP at 25° C., is 0.97 dl/g. The glass transition temperature (Tg), measured by differential scanning calometry (DSC) is 285° C.

EXAMPLE 2

The procedure followed is as in Example 1, but a mixture of 66.7 mol % of BTDA and 33.3 mol % of pyromellitic dianhydride (PMDA) is used. Properties of the resulting copolyimide:
η=0.93 dl/g
Tg=304° C.

EXAMPLE 3

An industrial mixture of 3,3'-diethyl-4,4'-diaminodiphenylmethane, 3-ethyl-4,4'-diaminodiphenylmethane and 4,4'-diaminodiphenylmethane is reacted with a stoichiometric amount of BTDA and the product is cyclised to the polyimide, as described in Example 1.

$\eta = 1.00$ dl/g
Tg = 263° C.

EXAMPLE 4

Example 3 is repeated with a mixture of 50 mol % of BTDA and 50 mol % of PMDA. The resulting copolyimide has the following properties:
$\eta = 0.87$ dl/g
Tg = 288° C.

EXAMPLE 5

A solution of 4.02 g of diamine mixture according to Example 3 in NMP as the solvent is subjected to a condensation reaction with 3.78 g of BTDA (molar ratio of diamine mixture to BTDA =3:2) in a condensation apparatus as described in Example 1 to give a polyamide acid block with amino end groups. The solution is then cooled to −15° C. and 3.5717 g of isophthaloyl dichloride are subsequently first added, followed by 2.6791 g of diamine mixture (molar ratio of isophthaloyl dichloride: diamine mixture=3:2). By removing the cooling, the temperature gradually rises to room temperature. After 5 hours, 3 ml of propylene oxide are added, and after another half an hour, 6.51 g of triethylamine and 26.6 g of acetic anhydride are added. The mixture is stirred overnight and the block copolyamide is precipitated the following day by stirring the mixture into water. Properties:
$\eta = 0.82$ dl/g
Tg = 221° C.

EXAMPLE 6

A mixture of 4,4'-diaminodiphenylmethane and 2,4-diaminotoluene (molar ratio 19.7:80.3) is subjected to a polycondensation reaction with the equivalent amount of BTDA as described in Example 1. Properties of the polyimide:
$\eta = 0.43$ dl/g
Tg = 309° C.

EXAMPLE 7

A mixture of 2,4-diaminotoluene and 5(6)-amino-1-(4-aminophenyl)-1,3,3-trimethylindane (molar ratio 54.4:45.6) is subjected to a polycondensation reaction with an equivalent amount of BTDA as described in Example 1. Properties of the copolyimide:
$\eta = 0.42$ dl/g
Tg = 309° C.

EXAMPLES 8 and 9

Polyimides are prepared by polycondensation of BTDA with an equivalent amount of 2-amino-6-methyl-6-(4-aminophenyl)-heptane or 2-amino-6-methyl-6-(3-ethyl-4-aminophenyl)heptane in a manner similar to that described in Example 1. Properties of the polyimides:
$\eta = 0.34$ and 0.23 dl/g
Tg = 177° C. and 170° C.

EXAMPLE 10

A mixture of 13.21 g (0.038 mol) of 1,10-diamino-1,10-di-n-hexyldecane and 13.34 g of BTDA (0.038 mol) in 100 ml of o-dichlorobenzene is stirred under nitrogen for 30 minutes in a sulfonation flask with a stirrer, internal thermometer, nitrogen inlet tube and water separator. The mixture is then heated slowly to the reflux temperature (175° C.), a clear light yellow solution being formed. The water of condensation is distilled off together with the o-dichlorobenzene in the course of 90 minutes, and is removed in the water separator.

A sample is isolated for analytical purposes by stirring a portion of the cooled solution into hexane, filtering off the product and drying it. Properties of the polyimide:
$\eta = 0.36$ dl/g
Tg = 63° C.

EXAMPLES 11-20

The following diamines are subjected to a polycondensation reaction with BTDA to give polyimides as described in Example 1, and the stated properties of the polymers are determined.

| Example | Diamine | $\eta$ (dl/g) | Tg (°C.) |
|---|---|---|---|
| 11 | $\left( \begin{array}{c} CH_3 \diagdown \diagup CH_3 \\ CH \\ H_2N-\phantom{xx}-CH_2 \end{array} \right)_2$ | 0.75 | 264 |
| 12 | $\left( \begin{array}{c} CH_3 \\ H_2N-\phantom{xx}-CH_2 \end{array} \right)_2$ | 1.08 | 265 |
| 13 | $H_2N-\phantom{xx}-CH_2$ <br> OCH$_3$ | 0.75 | 251 |
| 14 | $\left( H_2N-(CH_2)_3-\underset{\underset{CH_3}{\mid}}{\overset{\overset{CH_3}{\mid}}{Si}}-O \right)_2$ | 0.239 | 76 |
| 15 | $\left( H_2N-(CH_2)_3-\underset{\underset{CH_3}{\mid}}{\overset{\overset{CH_3}{\mid}}{Si}}-O \right)_2$ 30 Mol % <br><br> $H_2N-\phantom{xx}\underset{\underset{CH_3}{\phantom{x}} \phantom{x} CH_3}{\overset{CH_3}{\diagup\diagdown}}\phantom{xx}-NH_2$ 70 Mol % | 0.674 | 266 |
| 16 | $H_2N\text{+}CH_2\text{)}_3\text{-}\underset{\underset{CH_3}{\mid}}{\overset{\overset{CH_3}{\mid}}{Si}}-O\text{-}\underset{\underset{CH_3}{\mid}}{\overset{\overset{CH_3}{\mid}}{Si}}\text{+}CH_2\text{)}_3NH_2$ $_{3,2}$ | 0.167 | 120 |
| 17 | $\left( \begin{array}{c} H_3C \\ H_2N-\phantom{xx}-OCH_2\underset{\underset{CH_3}{\mid}}{\overset{\overset{CH_3}{\mid}}{Si}}-O \end{array} \right)_2$ | 0.248 | 146 |

-continued

| Example | Diamine | η (dl/g) | Tg (°C.) |
|---|---|---|---|
| 18 | H₂N-[ring with SCH₂CH₂OH]-NH₂ (80 Mol %) / (H₂N-⟨ ⟩)₂-CH₂ (20 Mol %) | 0.164 | 200 |
| 19 | (⟨ ⟩-CH₂-)₂-S with NH₂ | 0.376 | 204 |
| 20 | (⟨ ⟩-CH₂-)₂-O with NH₂ | 0.115 | 197 |

*Conversion on cyclisation with acetic anhydride in ethyl acetate

EXAMPLE 21

(Polyimide from isocyanate and anhydride)

0.7905 g (0.0021 mol) of N,N'-di-(3-isocyanato-4-methyl)-phenyl-parabanic acid and 1.4633 g (0.0084 mol) of toluene 2,4-diisocyanate in dimethylsulfoxide (23 ml) are initially introduced into a reaction vessel with a stirrer, reflux condenser and gas inlet tube at room temperature under $N_2$, and 3.386 g (0.0105 mol) of benzophenonetetracarboxylic acid dianhydride are added. The mixture is warmed to 90° C. and kept at this temperature for 24 hours. After cooling, the solution is stirred into water and the polymer is precipitated.

η=0.228 dl/g.
Tg=349° C.

EXAMPLE 22

(Polyimide/polyester-amide)

1.5 g (7.39 mmol) of isophthaloyl dichloride are dissolved in 38 ml of N-methylpyrrolidone (NMP) in a reaction vessel and the solution is cooled to −15° C. 0.537 g (4.92 mmol) of m-aminophenol and 1.4 ml of triethylamine are then added. After 30 minutes, 2.832 g (17.2 mmol) of 3,6-diaminodurene and 0.65 ml of triethylamine are added. By removing the cooling bath, the temperature is allowed to rise to 0° C., and 4.76 g (14.78 mmol) of BTDA are added. After the mixture has been stirred at room temperature for 8 hours, the polyamide acid is cyclised to the polyimide over a period of 16 hours by addition of 4.5 ml of triethylamine and 12.6 ml of acetic anhydride, and the polyimide is worked up in the customary manner.

η=0.38 dl/g.

EXAMPLE 23

(Polyimide/polycarbonate)

The following components are reacted with one another in the following sequence under the same conditions as in Example 26: 0.008 mol of phosgene, 0.0053 mol of bisphenol A, 0.01866 mol of mesitylenediamine and 0.016 mol of BTDA.

η=0.16 dl/g
Tg=261° C.

EXAMPLE 24

(Polyimide/polyamide-imide)

7.5 mmol of 4,4'-diamino-3,5,3',5'-tetraethyldiphenylmethane and 2.5 mmol of 4,4'-diaminodiphenylmethane are dissolved in 25 ml of NMP, and the solution is cooled to −15° C. and reacted with 2.5 mmol of trimellitic anhydride chloride in the presence of 0.4 ml of triethylamine. The prepolymer thereby formed is then further reacted with 7.5 mmol of BTDA and the product is subsequently cyclised with triethylamine and acetic anhydride.

η=0.58 dl/g
Tg=257° C.

EXAMPLE 25

(Polyimide-ester)

20 mmol of 3-amino-6-hydroxydurene are reacted with 0.01 mol of BTDA in 34.5 ml of NMP at 0° C. 0.01 mol of isophthaloyl dichloride and 6.1 ml of triethylamine are then added at −15° C. After 15 minutes, the cooling is removed and stirring is continued at room temperature for 8 hours. The cyclisation is effected with acetic anhydride.

η=0.09 dl/g
Tg=127° C.

EXAMPLE 26

(Polyimide/polyphenylene sulfide)

1.6458 g of 3,6-diaminodurene and 0.9333 g of a polyphenylene sulfide with amino end groups [prepared according to Polymer Bulletin 4, 459–466 (1981)] are reacted with 3.4313 g of BTDA in 24 ml of NMP at 0° to 25° C. for 24 hours and the product is then cyclised with triethylamine and acetic anhydride.

η=0.576 dl/g
Tg=411° C.

EXAMPLE 27

(Polyimide/polyether-sulfone)

The polyether-sulfone with amino end groups used for this is prepared by condensation of 4,4'-dichlorodiphenyl sulfone, bisphenol A and 4-chloronitrobenzene in the presence of potassium carbonate in dimethylformamide and subsequent reduction of the terminal nitro groups. In a manner similar to that in Example 26, 3.018 g of 3,6-diaminodurene and 1.796 g of the polyether-sulfone are reacted with 6.231 g of BTDA in 44 ml of NMP and the product is cyclised to the polyimide.

η=0.516
Tg=380° C.

(B) Use Examples

A thin film of polymer is produced on a sheet of plastic, which is laminated with copper on one side, by centrifuging on a 5% polymer solution and then removing the solvent in a circulating air oven. The solvents used are acetophenone (polymers from Examples 1, 2 and 4), butyrolactone (Example 3), o-dichlorobenzene (Example 10, without isolation of the polymer) and N-methylpyrrolidone for the polymers of the remaining examples.

The sheets thus coated are exposed through a photomask (Stouffer wedge) at room temperature with a 1,000 watt UV lamp from a distance of 18 cm. The exposed sheets are then developed with a solvent, the non-exposed portions being dissolved away from the polymer film. The relief image is then rendered visible by etching away the exposed copper layer with FeCl₃ solution.

The exposure time, the developer used and the photosensitivity are shown in the following table. MEK is methyl ethyl ketone and DMF is dimethylformamide.

TABLE

| Polymer according to Example | Exposure time (seconds) | Developer | Sensitivity (Stouffer scale) |
|---|---|---|---|
| 1 | 120 | NMP | 6–7 |
| 2 | 120 | NMP | 5 |
| 3 | 100 | NMP | 5 |
| 4 | 240 | NMP | 4–5 |
| 5 | 300 | NMP | 8 |
| 6 | 360 | NMP | 6 |
| 7 | 360 | NMP | 3 |
| 8 | 120 | NMP/MEK (1:1) | 6 |
| 9 | 120 | NMP/MEK (1:1) | 9 |
| 10 | 15 | NMP | 7 |
| 11 | 5 | DMF | 5 |
| 12 | 600 | NMP | 4–5 |
| 13 | 300 | DMF | 5–6 |
| 14 | 180 | NMP | 4 |
| 15 | 500 | Xylene/CHCl₃ (1:2) | 4 |
| 16 | 120 | NMP | 3 |
| 17 | 600 | Toluene/CHCl₃ (9:1) | 1 |
| 18 | 900 | NMP | 1 |
| 19 | 240 | NMP | 6 |
| 20 | 600 | Toluene/NMP (3:10) | 1 |
| 21 | 600 | NMP | 3 |
| 22 | 300 | CHCl₃ | 7–8 |
| 23 | 360 | NMP | 3 |
| 24 | 300 | NMP | 9 |
| 25 | 300 | NMP | 3–4 |
| 26 | 240 | NMP | 5–6 |
| 27 | 120 | NMP | 7 |

What is claimed is:

1. A process for the preparation of a relief image on a carrier which comprises
exposing a coating of a radiation-sensitive polymer applied on said carrier whereein the polymer is a homopolymer or copolymer with at least 5 mol %, based on the polymer, of structural units of the formula I

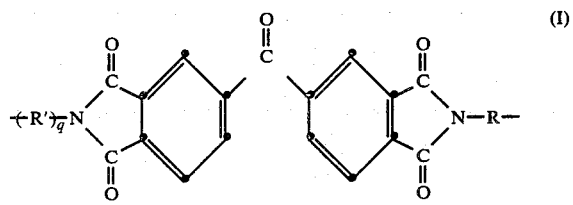

in which R is a divalent unsubstituted or substituted aliphatic radical or said radical interrupted by hetero-atoms or aromatic, heterocyclic or cycloaliphatic groups, an unsubstituted or substituted cycloaliphatic or araliphatic radical, an aromatic radical in which two aryl nuclei are linked via an aliphatic group, or an aromatic radical which is substituted by at least one alkyl, cycloalkyl, alkoxy, alkoxyalkyl, alkylthio, alkylthioalkyl, hydroxyalkyl, hydroxyalkoxy, hydroxalkylthio or aralkyl group or in which two adjacent C atoms of the aromatic radical are substituted by an alkylene group, R' independently has the same meaning as R and q is 0 or 1, an aromatic radical R not being substituted by alkylene or not being substituted by the abovementioned radicals in both ortho-positions relative to the N atom if q is 0, imagewise to actinic or high-energy radiation through a photomask, and then removing the non-exposed portions with a developer.

2. A process according to claim 1 in which the homopolymer or copolymer contains 5 to 100 mol % of structural units of the formula I, based on the polymer.

3. A process according to claim 1 in which the substituent on the aromatic radical contains 1 to 20 C atoms.

4. A process according to claim 1 in which the substituent on the aromatic radical is alkyl, alkoxy or alkoxyalkyl with 1 to 6 C atoms, benzyl, trimethylene or tetramethylene.

5. A process according to claim 1 in which one or two substituents on the aromatic radical are bonded in the ortho-position relative to the N atoms.

6. A process according to claim 1 in which an aliphatic radical R contains 2 to 30 C atoms, a cycloaliphatic radical R contains 5 to 8 ring C atoms, an araliphatic radical R contains 7 to 30 C atoms or a substituted aromatic radical R contains 7 to 30 C atoms.

7. A process according to claim 1 in which aliphatic radical R is linear or branched alkylene, or said alkylene interrupted by oxygen atoms, NH, NR$^a$ or ⊕NR₂ⓐ Gθ, in which R$^a$ is alkyl with 1 to 12 C atoms, cycloalkyl with 5 or 6 ring C atoms, phenyl or benzyl and Gθ is the anion of a protic acid, or by cyclohexylene, naphthylene, phenylene or hydantions, a cycloaliphatic radical R is monocyclic or bicyclic cycloalkylene which has 5 to 7 ring C atoms and is unsubstituted or substituted by alkyl, an araliphatic radical R is aralkylene which is unsubstituted or substituted on the aryl by alkyl, the alkylene radical being linear or branched, or an aromatic radical R is a hydrocarbon radical or a pyridine radical, which is substituted by alkyl, alkoxy, alkoxyalkyl, trimethylene or tetramethylene.

8. A process according to claim 1 in which aliphatic radical R is linear or branched alkylene with 6 to 30 C atoms, —(CH₂)$_m$—R¹—(CH₂)$_n$—, in which R¹ is phenylene, naphthylene, cyclopentylene or cyclohexylene and m and n independently of one another are the number 1, 2 or 3, —R²—(OR³)$_p$—O—R²—, in which R² is ethylene, 1,2—propylene, 1,3-propylene or 2-methyl-1,3-propylene, R³ is ethylene, 1,2-propylene, 1,2-butylene, 1,3-propylene or 1,4-butylene and p is a number from 1 to 100, or

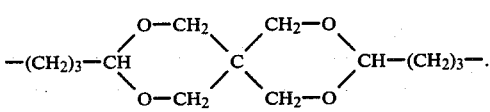

9. A process according to claim 1 in which a cycloaliphatic radical R is a radical of the formula

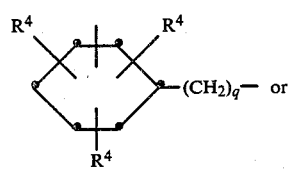

-continued

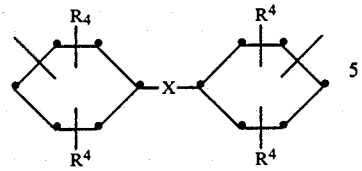

in which q is 0 or 1, the radicals $R^4$ independently of one another are hydrogen or alkyl with 1 to 6 C atoms and X is a direct bond, O, S, alkylene with 1 to 3 C atoms or alkylidene with 2 to 6 C atoms.

10. A process according to claim 1 wherein the araliphatic radical has the formula

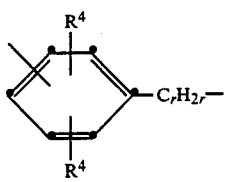

in which the radicals $R^4$ independently of one another are hydrogen atoms or alkyl with 1 to 6 C atoms and r is an integer from 1 to 16.

11. A process according to claim 1 in which the aromatic radical has the formula

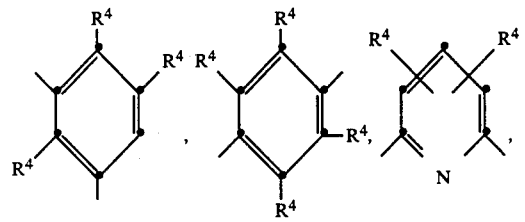

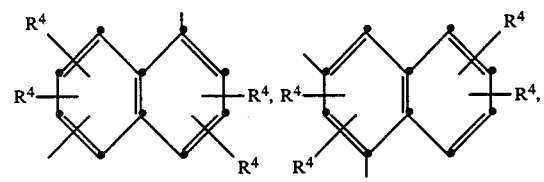

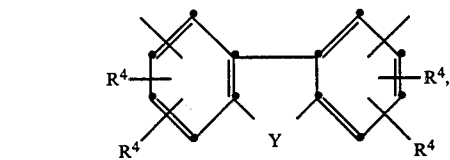

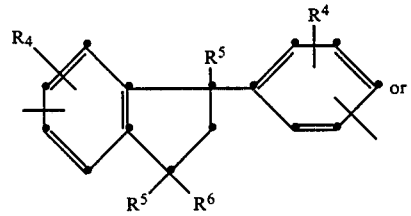

-continued

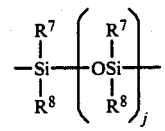

in which, in the case of monosubstitution, one radical $R^4$ is alkyl with 1 to 6 C atoms and the other radicals $R^4$ are hydrogen, and in the case of di-, tri- or tetra-substitution, two radicals $R^4$ are alkyl with 1 to 6 C atoms and the other radicals $R^4$ are hydrogen atoms or alkyl with 1 to 6 C atoms, or in the case of di-, tri- or tetra-substitution, two vicinal radicals $R^4$ in the phenyl ring are trimethylene or tetramethylene and the other radicals $R^4$ are hydrogen atoms or alkyl with 1 to 6 C atoms, Y is O, S, NH, CO or $CH_2$, $R^5$ is a hydrogen atom or alkyl with 1 to 5 C atoms, $R^6$ is alkyl with 1 to 5 C atoms and Z is a direct bond, O, S, SO, $SO_2$, CO, $$\overset{O}{\underset{\|}{C}}O, \overset{O}{\underset{\|}{C}}NR^7,$$

$NR^7$, CONH, NH, $R^7SiR^8$, $R^7OSiOR^8$,

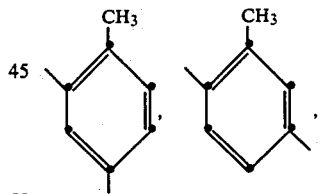

alkylene with 1 to 6 C atoms, alkenylene or alkylidene with 2 to 6 C atoms, phenylene or phenyldioxy, in which $R^7$ and $R^8$ independently of one another are alkyl with 1 to 6 C atoms or phenyl and j is 1–10.

12. A process according to claim 1 in which the aromatic radical is

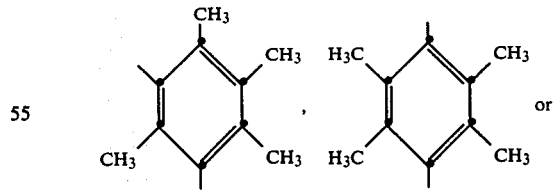

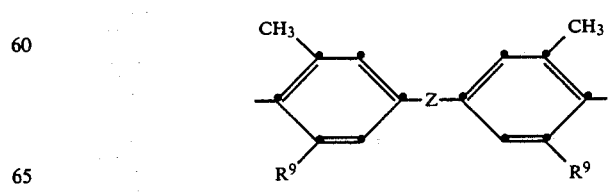

in which Z is a direct bond, O or, in particular, $CH_2$ and $R^9$ is a hydrogen atoms, methyl or ethyl.

13. A process according to claim 1 in which the homopolymer or copolymer is selected from the group consisting of polyimides, polyamides, saturated polyesters, polycarbonates, polyamide-imides, polyester-imides, polyester-amides, polysiloxanes, unsaturated polyesters, epoxy resins, the aromatic polyethers;, the aromatic polyether=ketones, the aromatic polyethersulfones, the aromatic polyketones, the aromatic polythioethers and mixtures of these polymers.

14. A process according to claim 1 in which the polymer is a polyimide with recurring structural elements of the formula I in which q is 0 or a copolyimide of recurring structural elements of the formula I in which q is 0 and recurring structural elements of the formula II

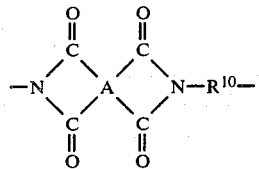

in which A is a tetravalent organic radical and $R^{10}$ is a divalent organic radical.

15. A process according to claim 1 in which the polymer is a polyamide or copolyamide of organic diamines, dicarboxylic acids, ω-aminocarboxylic acids and diamines or dicarboxylic acids with structural elements of the formula I in which q is 1 and in which amine groups or carboxyl groups are bonded to the R and R' groups.

16. A process according to claim 1 wherein the polymer is a polyester or copolyester of organic diols, dicarboxylic acids, hydroxycarboxylic acids and diols or dicarboxylic acids with structural elements of the formula I in which q is 1 and in which hydroxyl or carboxyl groups are bonded to the R and R' groups.

17. A relief image which is obtained by the process according to claim 1.

* * * * *